(12) United States Patent
Schwab et al.

(10) Patent No.: US 12,136,578 B2
(45) Date of Patent: Nov. 5, 2024

(54) INTERLAYER OF SUB-STRUCTURE HAVING ELEVATIONS AND FURTHER SUB-STRUCTURE WITH FILLER PARTICLES IN RECESSES BETWEEN THE ELEVATIONS

(71) Applicant: Infineon Technologies AG, Neubiberg (DE)

(72) Inventors: Stefan Schwab, Regensburg (DE); Edmund Riedl, Wald (DE)

(73) Assignee: Infineon Technologies AG, Neubiberg (DE)

(*) Notice: Subject to any disclaimer, the term of this patent is extended or adjusted under 35 U.S.C. 154(b) by 184 days.

(21) Appl. No.: 17/238,372

(22) Filed: Apr. 23, 2021

(65) Prior Publication Data
US 2021/0335686 A1    Oct. 28, 2021

(30) Foreign Application Priority Data
Apr. 23, 2020 (DE) .......................... 102020111071.5

(51) Int. Cl.
| | |
|---|---|
| H01L 23/31 | (2006.01) |
| H01L 21/54 | (2006.01) |
| H01L 21/56 | (2006.01) |
| H01L 23/42 | (2006.01) |
| H01L 23/495 | (2006.01) |

(52) U.S. Cl.
CPC .......... *H01L 23/3142* (2013.01); *H01L 21/54* (2013.01); *H01L 21/565* (2013.01); *H01L 23/42* (2013.01); *H01L 23/49575* (2013.01)

(58) Field of Classification Search
CPC .......... H01L 23/3142; H01L 23/49575; H01L 21/565; H01L 21/54
See application file for complete search history.

(56) References Cited

U.S. PATENT DOCUMENTS

| | | |
|---|---|---|
| 5,116,885 A | 5/1992 | Hattori et al. |
| 2007/0262432 A1 | 11/2007 | Otremba |
| 2016/0211235 A1 | 7/2016 | Chen et al. |
| 2018/0082921 A1* | 3/2018 | Grassmann ....... H01L 23/49575 |
| 2021/0050273 A1* | 2/2021 | Hsieh ................... H01L 23/295 |

FOREIGN PATENT DOCUMENTS

| | | |
|---|---|---|
| CN | 101369561 A | 2/2009 |
| CN | 103531490 A | 1/2014 |
| DE | 102004047510 A1 | 4/2006 |

* cited by examiner

*Primary Examiner* — Dale E Page
*Assistant Examiner* — Abbigale A Boyle
(74) *Attorney, Agent, or Firm* — Murphy, Bilak & Homiller, PLLC

(57) ABSTRACT

A structure includes a first sub-structure and a second sub-structure coupled with the first sub-structure and being a composite including filler particles in a matrix. A surface of the first sub-structure has a surface profile with first elevations and first recesses configured to enable at least part of the filler particles to at least partially enter the first recesses to thereby form an interlayer including the first elevations of the first sub-structure and filler particles in the matrix of the second sub-structure.

15 Claims, 5 Drawing Sheets

INTERLAYER OF SUB-STRUCTURE HAVING ELEVATIONS AND FURTHER SUB-STRUCTURE WITH FILLER PARTICLES IN RECESSES BETWEEN THE ELEVATIONS

TECHNICAL FIELD

Various embodiments relate generally to a structure, a package, and a method of manufacturing a structure.

BACKGROUND

A conventional package may comprise an electronic component mounted on a chip carrier such as a leadframe, may be electrically connected by a bond wire extending from the chip to the chip carrier, and may be molded using a mold compound as an encapsulant.

Delamination of constituents of a package may be an issue.

SUMMARY

There may be a need to form a material interface to an encapsulant to obtain a proper adhesion.

According to an exemplary embodiment, a structure is provided which comprises a first sub-structure and a second sub-structure coupled with the first sub-structure and being a composite comprising filler particles in a matrix, wherein a surface of the first sub-structure has a surface profile with first elevations and first recesses configured for enabling at least part of the filler particles to at least partially enter the first recesses to thereby form an interlayer comprising the first elevations of the first sub-structure and filler particles in the matrix of the second sub-structure.

According to another exemplary embodiment, a package is provided which comprises at least one functional package body, an encapsulant encapsulating at least part of the at least one functional package body, and a structure having the above mentioned features as an interface between the encapsulant and at least part of the at least one functional package body, wherein the first sub-structure forms part of the at least one functional package body and the second sub-structure forms at least part of the encapsulant.

According to another exemplary embodiment, a method of manufacturing a structure is provided, wherein the method comprises coupling a first sub-structure with a second sub-structure, configuring the second sub-structure as a composite comprising filler particles in a matrix, configuring a surface of the first sub-structure with a surface profile having first elevations and first recesses, and at least partially inserting at least part of the filler particles in the first recesses so as to form an interlayer comprising the first elevations of the first sub-structure and filler particles in the matrix of the second sub-structure.

According to an exemplary embodiment, a structure is provided which comprises a first sub-structure connected with a second sub-structure, the latter having filler particles in a matrix. Conventionally, such an arrangement has a mechanical weak point at an interface between the first sub-structure and the second sub-structure. According to an exemplary embodiment, an improved flexural strength may be obtained in an interlayer in a transition region between the first sub-structure and the second sub-structure by providing the first sub-structure with a sequence of first elevations and first recesses, the first recesses being dimensioned so that filler particles may enter said first recesses. As a result, an interlayer of mixed material properties due to the presence of first elevations, filler particles and matrix material may be obtained which surprisingly shows an enhanced flexible strength in the interlayer. Hence, a conventional mechanical weak point in an interface region between first sub-structure and second sub-structure may be overcome and the mechanical integrity of the structure as a whole may be improved. In particular, adhesion between the first sub-structure and the second sub-structure to be significantly promoted by the interlayer. Crack formation in the interlayer may be strongly suppressed.

Highly advantageously, a structure according to an exemplary embodiment may be implemented as an interface between an encapsulant and a functional package body of a package (such as a package for packaging an encapsulated electronic component). For instance, such a functional package body may be said electronic component, a carrier thereunder and/or another electrically conductive conduction element (such as a clip or a bond wire). With an above-described structure in an interface region between encapsulant and functional package body, a delamination of constituents of the package, a loss of electric reliability, a deterioration of mechanical integrity and a reduction of the performance of the package may be reliably prevented.

In the following, further exemplary embodiments of the method, the structure and the package will be explained.

In the context of the present application, the term "package" may particularly denote an electronic device comprising one or more electronic components packaged using an encapsulant. Optionally, also a carrier for the electronic component and/or one or more electrically conductive contact elements (such as bond wires or clips) may be implemented in a package.

In the context of the present application, the term "functional package body" may in particular denote any constituent or member of the package contributing to the function of the package. Such a functional package body may for instance be an encapsulated electronic component, such as a semiconductor chip. Another example for a functional package body is a carrier carrying an electronic component, for instance a leadframe-type carrier. Yet another example for a functional package body is an electrically conductive connection structure, such as a clip or a bond wire used for connecting an electronic component with a carrier.

In the context of the present application, the term "encapsulant" may particularly denote an electrically insulating material surrounding at least part of an electronic component and/or at least part of a carrier to provide mechanical protection, electrical insulation, and optionally a contribution to heat removal during operation. In particular, said encapsulant may be a mold compound.

In the context of the present application, the term "matrix" may particularly denote a curable liquid or flowable medium, and/or a slurry. The matrix may become solid upon curing. For instance, the matrix may comprise a resin such as an epoxy resin.

In the context of the present application, the term "filler particles" may particularly denote a (in particular powderous or granulate-type) substance filling out interior volumes in the matrix. By the selection of the filler, the physical and/or chemical properties of the encapsulant can be adjusted. Such properties may include the coefficient of thermal expansion, the thermal conductivity, the dielectric properties, etc. The filler particles may thus be added so as to fine tune the physical, chemical, etc. properties of the encapsulant. For instance, the filler particles may increase thermal conductivity of the encapsulant so as to efficiently remove heat out of an interior of the package (such heat may be generated by the electronic component, for instance when embodied as power semiconductor chip). It is also possible that the filler particles provide an improved dielectric decoupling between the electronic component and the surrounding of the package.

In an embodiment, a large number of first elevations and a large number of first recesses may be provided, in particular at least 10, more particularly at least 100, preferably at least 1000, each.

In an embodiment, the first elevations and first recesses define a first roughness. A pronounced surface roughness between first sub-structure and second sub-structure may increase the connection surface between first sub-structure and second sub-structure and may therefore also improve the mechanics robustness of the structure as a whole.

In an embodiment, the first elevations and the first recesses have a depth in a range from 0.1 μm to 50 μm, in particular in a range from 0.1 μm to 10 μm, more particularly in a range from 0.6 μm to 5 μm. The depth may denote a vertical distance between a bottom of a first recess and a top of an adjacent first elevation. Hence, the first elevations in collaboration with the first recesses may form microstructures, i.e. microscopic structures having dimensions in the order of magnitude of micrometers. This may enable filler particles, having dimensions being particularly appropriate for mold compounds of semiconductor packages, to enter the first recesses in the interlayer for increasing the mechanical robustness.

In an embodiment, the filler particles (for instance all or at least 80% or at least 90% of the filler particles) have a diameter in a range from 10 nm to 10 μm, in particular in a range from 20 nm to 2 μm, more particularly in a range from 50 nm to 1 μm. Thus, the dimensions of the filler particles may be adjusted in accordance with the dimensions of the first elevations and the first recesses for enhancing the flexural strength of the interlayer. In an embodiment, even larger filler particles can be in the mold compound, but for instance not in the interlayer. Thus, filler particles in the mold compound may be even larger, for instance up to 100 μm. Thus, there can be larger filler particles in the resin. It is however possible to use mixtures with filler particles that are smaller down to the values listed above.

In an embodiment, a ratio between a vertical depth of said first elevations (i.e. a vertical distance between a bottom of a first recess and a top of an adjacent first elevation) and a lateral distance between top peaks of adjacent first elevations is at least 0.2, in particular is in a range from 0.2 to 5. In other words, the first elevations may have a pronounced vertical height and a relatively small horizontal spacing in between. By taking this measure, the protection of the interlayer against breakage and delamination in the event of mechanical stress may be significantly improved.

In an embodiment, the surface of the first sub-structure has second elevations and second recesses formed on the first elevations and/or on the first recesses. The second elevations and the second recesses may be provided with smaller dimensions than the first elevations and the first recesses. Highly advantageously, the first elevations and first recesses may be modulated by second elevations and second recesses to thereby refine the adhesion characteristics of the interlayer. Descriptively speaking, the first elevations and the first recesses may increase the flexural strength at the interface between first sub-structure and second sub-structure by filler incorporation. Synergistically, the second elevations and the second recesses may increase the adhesion by promoting a mechanical anchoring. In particular the combination of the first and second recesses and elevations may significantly improve the mechanical properties of the structure or package as a whole.

In an embodiment, a large number of second elevations and a large number of second recesses may be provided, in particular at least 10, more particularly at least 100, preferably at least 1000, each.

In an embodiment, the second elevations and second recesses define a second roughness being smaller than the first roughness. Advantageously, also the second elevations and second recesses provide an additional roughness of the surface of the first sub-structure, however on a smaller dimensional scale.

In an embodiment, the second elevations and second recesses have a depth in a range from 1 nm to 100 nm, in particular in a range from 10 nm to 50 nm. Hence, the second elevations in collaboration with the second recesses may form nanostructures, i.e. nanoscopic structures having dimensions in the order of magnitude of nanometres. This may promote adhesion between the first sub-structure and the second sub-structure for increasing the mechanical robustness of the structure and the package as a whole.

In an embodiment, the second elevations and second recesses are configured for enabling at least part of the matrix to at least partially enter the second recesses. However, the second recesses may also be configured for disabling the filler particles to enter the second recesses. Thus, matrix material, but not filler particles, may be enabled to enter the second recesses in view of the dimensional constraints. Matrix material in the second recesses may improve the adhesion between first sub-structure and second sub-structure and may also contribute to a mechanical interlocking. Larger filler particles may increase the flexural strength when being located in the first recesses.

In an embodiment, the filler particles have a homogeneous diameter. In other words, different filler particles may all have essentially the same dimensions. Alternatively and preferably, the filler particles may however have a diameter distribution. When being provided with a diameter distribution rather than a homogeneous diameter, the filler particles may show an even better adhesion between first sub-structure and second sub-structure.

In an embodiment, a first portion of the first sub-structure defining the first elevations and a second portion of the first sub-structure defining the second elevations are made of the same material. By integrally forming the first elevations and the second elevations from a common body of the same material, the mechanical integrity of the structure as a whole may be improved.

In another embodiment, a first portion of the first sub-structure defining the first elevations and a second portion of the first sub-structure defining the second elevations are made of different materials. By taking this measure, the properties of the first elevations and the properties of the second elevations may be adjusted individually for fine-tuning the desired properties for improving adhesion.

In an embodiment, the first sub-structure comprises a base body on which the first elevations are formed. Such a base body or support may be made subject to a specific treatment, for instance electroplating, for forming the sequence of first elevations and first recesses thereon.

In an embodiment, the base body and the first elevations are made of the same material. This may enhance the stability of the structure as a whole.

In another embodiment, the base body and the first elevations are made of different materials. This may allow for an individual adjustment of the base body material and material of the first elevations. For instance, the first elevations may be deposited on the base body.

In an embodiment, the base body and the first elevations are in direct physical contact with each other. This may contribute to a proper adhesion or cohesion.

In an embodiment, the structure comprises an intermediate layer, in particular a seed layer, between the base body and the first elevations. Sandwiching a seed layer between base body and elevations may simplify formation of the first elevations, and may also promote adhesion. Moreover, such a seed layer may also work as corrosion barrier. Thus, the seed layer can be a corrosion barrier or diffusion barrier. It can be formed of the same material as the first elevations or of different materials.

In a preferred embodiment, at least one undercut is formed between the base body and the first elevations. In the context of the present application, the term "undercut" may particularly denote a hollow space delimited by the base body and the first elevations in such a way, that, in an undercut region, an angle between a side wall of a respective first elevation and the base body is less than 90°, i.e. is an acute angle. An undercut may be a cut made in the lower part of the respective first elevation so as to create an overhang. An undercut may define a recessed surface that is inaccessible using a straight element. It has turned out that the formation of undercuts significantly improves the flexural strength in the interlayer, in particular in the presence of filler particles also in the one or more undercuts.

In an embodiment, the at least one undercut is formed to promote mechanical interlocking and thereby adhesion within the interlayer. This may further improve the mechanical robustness of the structure and the package. For instance, the at least one undercut corresponds to a pore geometry with a side angle smaller than 90°.

In an embodiment, the filler particles have a value of the coefficient of thermal expansion (CTE) selected so that the presence of the filler particles in the interlayer reduces a mismatch between the coefficients of thermal expansion between the first sub-structure and the second sub-structure compared with an absence of the filler particles in the interlayer. In other words, a CTE mismatch between first structure and matrix material may be reduced in the interlayer. As a consequence, thermal stress due to different thermal expansions of the first elevations and the matrix material upon temperature changes may be reduced.

In an embodiment, the interlayer has a thickness in a range from 0.1 µm to 10 µm, in particular in a range from 0.6 µm to 5 µm. With said dimensions, the improved flexural strength may be obtained very well.

In an embodiment, the first sub-structure comprises or consists of copper. However, the first sub-structure may also be made of other metals (for instance aluminum). An interface between a metal and an encapsulant may be a mechanical weak point in conventional packages.

In an embodiment, the second sub-structure is a mold compound. A mold compound may comprise a matrix of flowable and hardenable material and filler particles embedded therein. For instance, filler particles may be used to adjust the properties of the mold component. In particular, this adjustment may be made to enhance thermal conductivity, to adapt the coefficients of thermal expansion (CTE) and/or to increase the flexural strength.

In an embodiment, the structure comprises an additional adhesion promoting material between the second elevations and second recesses on the one hand and the second sub-structure on the other hand. For instance, such an additional adhesion promoting material may comprise fibers, a thin film and/or nanoparticles. Descriptively speaking, a triple adhesion promoting architecture may thus be provided, i.e. a coarser roughness (provided by the first elevations and the first recesses) combined with a finer roughness (provided by the second elevations and the second recesses) and an additional adhesion promoter thereon. This may further improve the mechanical robustness in the interlayer.

In an embodiment, at least part of the first elevations taper towards the second sub-structure. This may form sufficiently large openings simplifying for the filler particles to enter the first recesses.

In an embodiment, the first elevations and/or the second elevations are arranged in a two-dimensional random fashion. In other words, the first elevations and/or the second elevations may be arranged in a random fashion over a continuous surface area. Such a continuous adhesion promoting carpet with an irregular pattern of elevations and recesses has turned out to be a particular powerful profile for improving adhesion and enhancing flexural strength.

In an embodiment, the at least one functional package body comprises a carrier. In the context of the present application, the term "carrier" may particularly denote a support structure (which may be at least partially electrically conductive) which serves as a mechanical support for the electronic components to be mounted thereon, and which may also contribute to the electric interconnection between the electronic components and the periphery of the package. In other words, the carrier may fulfil a mechanical support function and an electric connection function. A carrier may comprise or consist of a single part, multiple parts joined via encapsulation or other package components, or a subassembly of carriers. When the carrier forms part of a leadframe, it may be or may comprise a die pad.

In an embodiment, the at least one functional package body comprises an electronic component. In the context of the present application, the term "electronic component" may in particular encompass a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), an actuator (for instance a loudspeaker), and a microelectromechanical system (MEMS). However, in other embodiments, the encapsulated device may also be of different type, such as a mechatronic member, in particular a mechanical switch, etc.

The electronic component may be mounted on the carrier. Thus, the carrier may fulfil a mechanical support function and also an electric coupling function.

In an embodiment, the at least one functional package body comprises an electrically conductive contact element electrically coupling the electronic component with the carrier. Such an electrically conductive contact element may be a clip, a bond wire or a bond ribbon. A clip may be a curved electrically conductive body accomplishing an electric connection with a high connection area to an upper main surface of a respective electronic component. Additionally or alternatively to such a clip, it is also possible to implement one or more other electrically conductive interconnect bodies in the package, for instance a bond wire and/or a bond ribbon connecting the electronic component with the carrier or connecting different pads of an electronic component.

In an embodiment, the first elevations and the second elevations are formed by electroplating. The term "electroplating" may denote a process that uses an electric current to reduce dissolved metal cations so that they form a thin coherent metal coating on an electrode. The term electroplating may also denote electrical oxidation of anions onto a solid substrate. Electroplating may be used to change the surface properties a base body for promoting adhesion. By adjusting the electroplating parameters in a galvanic reactor, properties of the first elevations and first recesses (and optionally also second elevations and second recesses) may be adjusted. For instance, parameters which may be used for adjusting the elevation and recess properties during electroplating are a proper selection of electrolyte composition, current density used for deposition, temperature, plating time (for instance in a range from 3 seconds to 7 seconds, for instance 5 seconds), etc. In particular, pulse plating may be advantageously applied. By making such an adjustment, a needle-type and/or sponge-type array of elevations and recesses may be obtained. This may allow the formation of the above-mentioned microstructures and nanostructures. It may also be possible to carry out laser roughening to form (in particular the second) microstructures.

In an embodiment, the method comprises forming the first elevations and the second elevations in a common process, in particular simultaneously. By forming first and second elevations as well as first and second recesses at the same time, a simple manufacture may be made possible. For instance, this may be done by electroplating.

In an embodiment, an adhesion promoter may be provided in the interlayer, preferably an adhesion promoter on at least two dimensional scales (in particular by the first elevations and recesses, and the second elevations and recesses). An adhesion promoter of a larger dimensional scale may be provided in form of the first elevations and first recesses, whereas an adhesion promoter of a smaller dimensional scale may be provided in form of the second elevations and second recesses. In the context of the present application, the term "adhesion promoter" may particularly denote any material and/or measure enhancing adhesion between the first sub-structure and the second sub-structure. More specifically, such an adhesion promoter (or coupling agent or bonding agent) may act as an interface between the first sub-structure and the second sub-structure to enhance adhesion between these two sub-structures.

In particular, a morphological adhesion promoter may be provided, i.e. an adhesion promoter having a morphological structure. Correspondingly, the manufacturing method may comprise forming an adhesion promoter, in particular a morphological adhesion promoter, on the respective functional package body before the encapsulating. In the context of the present application, the term "morphological structure" may particularly denote a structure having a topology and/or porous structure and/or being shaped in such a way so as to increase the connection surface with connected material of encapsulant and/or functional package body to thereby promote adhesion. Moreover, the morphology of a morphological adhesion promoter may cause an advantageous mechanical interlocking between material of encapsulant and/or functional package body on the one hand and material of the morphological adhesion promoter on the other hand. In other words, a morphological structure promotes adhesion due to its shape, rather than only promoting adhesion due to its chemistry. However, it is also possible that a morphological structure is synergistically made of material which, in view of its intrinsic properties, promotes adhesion additionally to the shape. In particular, a morphological adhesion promoter may be a porous material. A specific shaping and in particular increase of the interior surface of the adhesion promoter may enhance adhesion between first sub-structure and second sub-structure (for instance encapsulant and chip) mediated by the morphological adhesion promoter.

In an embodiment, the morphological adhesion promoter comprises at least one of the group consisting of a metallic structure, an alloy structure, a chromium structure, a vanadium structure, a molybdenum structure, a zinc structure, a manganese structure, a cobalt structure, a nickel structure, a copper structure, a flame deposited structure, a roughened metal structure (in particular a roughened copper structure or a roughened aluminum oxide structure), and any oxide, nitride, carbide, and selenide of any of said structures. All structures may comprise or consist of these metals and/or the alloys thereof. In addition, these structures may comprise or consist of these metals and their alloy-oxides. In particular, single oxides and mixed oxides are possible in different embodiments. Whether the alloy oxidizes or not may depend on the thermal budget in production. However, other materials and structures may be used for the morphological adhesion promoter as well. The above-mentioned flame deposited structure may comprise or consist of silicon dioxide, any titanium oxide (such as for instance $TiO_2$, $TiO$, $Ti_xO_y$), etc. Any organometallic precursor can be used that can be burned in a mixture with a burning gas such as propane or butane and form the specific metal oxide.

In particular, a morphological adhesion promoter may be formed using Atomic Layer Deposition (ALD), Chemical Vapor Deposition (CVD), etc.

In another embodiment, the adhesion promoter is an organic adhesion promoter, such as silane. Such an organic adhesion promoter may promote adhesion in view of its chemical properties.

In an embodiment, the first and/or second recesses comprise at least one of the group consisting of pores, dendrites, and gaps between islands of a patterned structure. However, other kinds of openings can be formed as well as long as they increase the surface of the morphological adhesion promoter and promote mechanical interlocking.

In an embodiment, the filler particles are selected from a group consisting of crystalline silica, fused silica, spherical silica, titanium oxide, aluminium hydroxide, magnesium hydroxide, zirconium dioxide, calcium carbonate, calcium silicate, talc, clay, carbon fiber, glass fiber and mixtures thereof. Other filler materials are however possible depending on the demands of a certain application. Filler particles (for example $SiO_2$, $Al_2O_3$, $Si_3N_4$, BN, AlN, diamond, etc.), for instance for improving thermal conductivity may be embedded in the encapsulant. However, other filler particles may be implemented in the encapsulant as well, in addition or alternatively to the mentioned filler particles. In particular, organic particles may be used as fillers (for instance, fillers can also comprise or consist of polymers or polymer mixtures, such as: epoxies, polyethylene, polypropylene, etc.). Also, it should be mentioned that the filler can be treated in a way to improve the adhesion between the filler and the encapsulant comprising the filler. Filler coatings can be of the group of silanes, thiols, or porous structures. Also, porous fillers can be used. In particular, filler particles may be provided as nanoparticles or microparticles. Filler particles may have identical dimensions or may be provided with a distribution of particle sizes. Such a particle size distribution may be preferred since it may allow for an improved filling of gaps in an interior of the encapsulant. For instance, the shape of the filler particles may be randomly, spherical, cuboid-like, flake-like, and film-like. The filler particles can be modified, coated, and/or treated as to improve the adhesion and/or the chemical binding to the surrounding matrix. Examples are silanes. A coating can also change the surface energy of the fillers and may thereby improve and enable the wetting of the solution/the matrix.

In an embodiment, the package comprises a carrier on which an electronic component is mounted. For instance, such a carrier may be a leadframe (for instance made of copper), a DAB (Direct Aluminum Bonding), DCB (Direct Copper Bonding) substrate, etc. Also at least part of the carrier may be encapsulated by the encapsulant, together with the electronic component.

Preferably, a surface of the electronic component (preferably an entire metallic surface of the electronic component) can be at least partially provided with the elevations and recesses, as described herein, before being at least partially encapsulated by an encapsulant. Also preferably, a surface of the carrier (preferably an entire metallic surface of the carrier) can be at least partially provided with the elevations and recesses, as described herein, before being at least partially encapsulated by an encapsulant. This may further improve mechanical reliability of the package.

In an embodiment, the package comprises an electrically conductive contact element electrically coupling the electronic component with the carrier. Preferably, a surface of the electrically conductive contact element (preferably an entire metallic surface of the electrically conductive contact element) can be at least partially provided with the elevations and recesses, as described herein, before being at least partially encapsulated by an encapsulant. For instance, the electrically conductive contact element may comprise a clip, a wire bond, and/or a ribbon bond. A clip may be a three-dimensionally bent plate type connection element which has two planar sections to be connected to an upper main surface of the respective electronic component and an upper main surface of the chip carrier, wherein the two mentioned planar sections are interconnected by a slanted connection section. As an alternative to such a clip, it is possible to use a wire bond or ribbon bond which is a flexible electrically conductive wire or ribbon shaped body having one end portion connected to the upper main surface of the respective chip and having an opposing other end portion being electrically connected to the chip carrier.

In an embodiment, the method comprises pre-treating at least part of the electronic component, carrier and/or electrically conductive contact element for promoting adhesion between the encapsulant and at least part of the electronic component, carrier and/or electrically conductive contact element. Thus, the adhesion between the above-described encapsulant and the functional package body may be improved by applying an adhesion promoting additional device-level treatment. Highly advantageously, it is possible to pre-treat the package or part thereof (for instance a metallic surface thereof) so as to improve its adhesion properties with regard to the above-described encapsulant. For instance, it is possible to carry out a surface activation of the surface of the package or part thereof to be encapsulated by the encapsulant. Such a surface activation may be accomplished, for instance, by a plasma treatment of the respective surface, in particular of the respective metallic surface.

In an embodiment, the package is configured as one of the group consisting of a leadframe connected power module, a Transistor Outline (TO) package, a Quad Flat No Leads Package (QFN) package, a Small Outline (SO) package, a Small Outline Transistor (SOT) package, and a Thin Small Outline Package (TSOP) package. Also packages for sensors and/or mechatronic devices are possible embodiments. Moreover, exemplary embodiments may also relate to packages functioning as nano-batteries or nano-fuel cells or other devices with chemical, mechanical, optical and/or magnetic actuators. Therefore, the package according to an exemplary embodiment is fully compatible with standard packaging concepts (in particular fully compatible with standard TO packaging concepts) and appears externally as a conventional package, which is highly user-convenient.

In an embodiment, the package is configured as power module, for instance molded power module. For instance, an exemplary embodiment of the package may be an intelligent power module (IPM). Another exemplary embodiment of the package is a dual inline package (DIP).

In an embodiment, the electronic component is configured as a power semiconductor chip. Thus, the electronic component (such as a semiconductor chip) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide). A semiconductor power chip may comprise one or more field effect transistors, diodes, inverter circuits, half-bridges, full-bridges, drivers, logic circuits, further devices, etc.

In an embodiment, the electronic component experiences a vertical current flow. The package architecture according to exemplary embodiments is particularly appropriate for high power applications in which a vertical current flow is desired, i.e. a current flow in a direction perpendicular to the two opposing main surfaces of the electronic component, one of which being used for mounting the electronic component on the carrier.

As substrate or wafer forming the basis of the electronic components, a semiconductor substrate, in particular a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings.

DETAILED DESCRIPTION

Figure 1A:
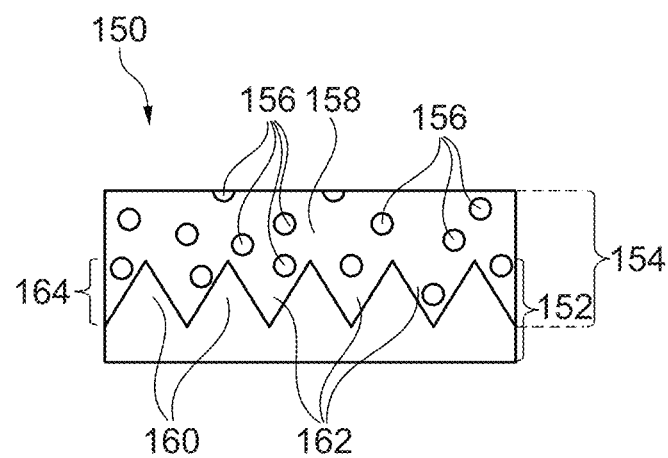
FIG. 1A illustrates a structure according to an exemplary embodiment.

The illustration in the drawing is schematically and not to scale.

Before exemplary embodiments will be described in more detail referring to the figures, some general considerations will be summarized based on which exemplary embodiments have been developed.

Adhesion between different materials is crucial for the device safety in many applications. In the semiconductor industry, especially the adhesion between a mold compound and other package components is crucial.

Recent studies of the present inventors revealed that while conventional solutions intend to strongly improve the adhesion by mechanical anchoring, there is still a weak spot at the interface between the molding compound and the other package materials such as the leadframe (or actually slightly above the interface). This weak spot is situated at the first layer of mold compound. Without wishing to be bound to specific theory, it is presently believed that this weak spot is caused by a reduced flexural strength in this area, which is caused by the fact that there are no fillers situated directly at the interface. Therefore, there is actually a layer of pure resin directly above an adhesion promoting layer on a base body. Said layer has a very low flexural strength as compared to the bulk properties of the mold material. This weak spot is where the delamination occurs—actually it may be a cohesive break instead of an adhesive break. Since the flexural strength of molding compounds may strongly decrease at higher temperature, the risk of a cohesive break above the interface may be strongly increased. Therefore, improving the flexural strength at the interface might strongly improve device reliability, especially at higher temperature.

A morphological adhesion promoter may be used for good adhesion. Mechanical anchoring can improve the adhesion. However, this does not improve the flexural strength of the interface. Therefore, in particular at higher temperature, there may be a risk of cohesive break in the filler free region in the first layers of the mold compound.

The present inventors have surprisingly found that, although a conventional adhesion promotor may increase adhesion toward the mold compound by mechanical interlocking, adhesion and mechanical interlocking between a morphological adhesion promoter layer and mold compound works so well, that a delamination mechanism (for example during shear tests) is shifted from an adhesive to a cohesive mode. As a result, mold may break in a filler free area of mold residues in a morphological adhesion promoting layer. This has been proven by TOF SIMS (Time of Flight-Secondary Ion Mass Spectrometry) analysis.

Additionally, it has been found that a filler free layer between a functional package body and a mold compound has a very high value of the coefficient of thermal expansion (CTE) which may result in high stress in the event of temperature changes.

The present inventors have further found that, as the weakest spot is not the interface itself, but the flexural strength in the mold material close to the interface, the material system can be further improved by improving the interface flexural strength. However, the flexural strength of the mold material close to the interface may be lower as there is no filler directly at the interface (similar to a reduced flexural strength in unfilled epoxy).

According to exemplary embodiments, it may be advantageous to combine a mechanical anchoring from a morphological adhesion promoter with a roughened surface. For instance, it may be advantageous to plate a mixture of microscopic and macroscopic elevations as a double adhesion promoter. This may improve the flexural strength of the interface, as filler particles of an encapsulant can partly be incorporated in an interlayer that can be formed by the porous adhesion promoter and the matrix or resin of the mold compound.

In conventional approaches, the above-described filler free region of the mold compound interface may constitute a weakness, as the CTE of the pure epoxy is far higher than the CTE of the bulk molding compound and also far higher than the CTE of the copper layer. This CTE mismatch may induce thermomechanical stress.

Exemplary embodiments can also reduce this CTE mismatch, as the filler, that will be incorporated in the interlayer, may decrease the CTE value of the mold compound, thus decreasing the thermomechanical stress.

In particular, an exemplary embodiment may improve the connection between the mold compound and other package materials (also denoted as functional package bodies) by improving the flexural strength at the interface.

For instance, it has been found that the adhesion of mold material can be increased by about 30% at room temperature. At higher temperatures, the effect may be expected to be even higher as the flexural strength of the resin is decreased at higher temperatures. There is also data available that shows a correlation between the shear force at the critical material interface at high shear temperature and the temperature dependent flexural strength. In particular, data with several mold compounds, including TOF-SIMS measurements, are available that show that there is a cohesive break in the filler-less mold compound layer above a morphological adhesion layer (there is still polymer in the morphological adhesion layer after shear off).

In view of the foregoing, an exemplary embodiment provides an interlayer at an interface between a first sub-structure and a second sub-structure with improved flexural strength. More specifically, an exemplary embodiment provides a first sub-structure (for instance a first material) in contact with a second sub-structure (for instance a second material), wherein the second material is a composite material composed of fillers of different sizes and a matrix system holding the filler together. The first sub-structure may be provided with a specific roughness that allows at least part of the filler particles to enter at least part of the rough layer during applying the second sub-structure on the first sub-structure. By taking this measure, it may be possible to form an interlayer at an interface between the first sub-structure and the second sub-structure. Said interlayer may be composed of the first sub-structure, the matrix of the second sub-structure and the filler particles of the second sub-structure.

Optionally and preferably, the first sub-structure may have a nano-structure that can be infiltrated by the matrix system of the second sub-structure while applying the second sub-structure on the first sub-structure (for instance a base structure with a morphological adhesion promoter).

Optionally and preferable, the interlayer may be provided with an additional closed layer below the nano-structured layer (for instance a seed layer of a morphological adhesion promoter). Such an additional layer can also be realized by very fine filler particles.

What concerns dimensions of said recesses or pore sizes, it is for instance possible to provide the first elevations and first recesses with dimensions or pore sizes in a range from 0.1 μm to 10 μm, for example 1 μm. Correspondingly, it is for instance possible to provide the second elevations and second recesses with dimensions or pore sizes in a range from 1 nm to 100 nm, for example 30 nm.

In particular, the combination of macro porosity (provided by the first elevations and first recesses) and micro porosity (provided by the second elevations and second recesses) may be highly advantageous for the following reasons: The micro porosity may increase the adhesion by mechanical anchoring, although flexural strength may be limiting when micro porosity is provided without macro porosity. The macro porosity may increase the flexural strength at the interface by filler incorporation. However, adhesion may be limiting when macro porosity is provided without micro porosity. With a combination of micro porosity with macro porosity, a highly advantageous synergistic joint may be obtained.

Advantageously, it may be possible to apply fibers on the surface after a treatment performing the morphological adhesion promoter to improve the flexural strength during encapsulation, in particular molding.

In another advantageous embodiment, it may be possible to apply a thin film of an active component (for example an epoxy cross linker) on top of a morphological adhesion layer by dipping before the molding process, which may cause the epoxy to have a stronger linkage close to the interface. Hence, taking this measure may further increase the flexural strength close to the morphological adhesion promoter layer, while the flexural strength in the mold compound may stay untouched.

In yet another embodiment, it may be possible to dip the morphological adhesion promoter layer (i.e. the first sub-structure comprising the first elevations and first recesses, and optionally the second elevations and second recesses) in a nano-particle containing bath so that nano-particles may attach to the morphological adhesion layer prior to encapsulation, in particular molding.

Advantageously, a first sub-structure according to an exemplary embodiment may be characterized by a non-directed but homogeneous roughness.

In one embodiment, the first sub-structure with the porous layer may be embodied as a ZnV morphological adhesion promoter. In an embodiment, the first structure may be treated by copper etching at grain boundaries. In yet another embodiment, the first sub-structure may be processed by laser surface structuring.

FIG. 1A illustrates a structure 150 according to an exemplary embodiment.

The cross-sectional view of FIG. 1A illustrates structure 150 comprising a first sub-structure 152 and a second sub-structure 154 in contact with the first sub-structure 152. The second sub-structure 154 is a composite comprising filler particles 156 in a matrix 158. A surface of the first sub-structure 152 has a surface profile with first elevations 160 and first recesses 162, each arranged between two neighboured first elevations 160 and configured for enabling filler particles 156 to enter the first recesses 162. As a result, an interlayer 164 is formed which comprises the first elevations 160 of the first sub-structure 152 and filler particles 156 in the matrix 158 of the second sub-structure 154.

Figure 1B:
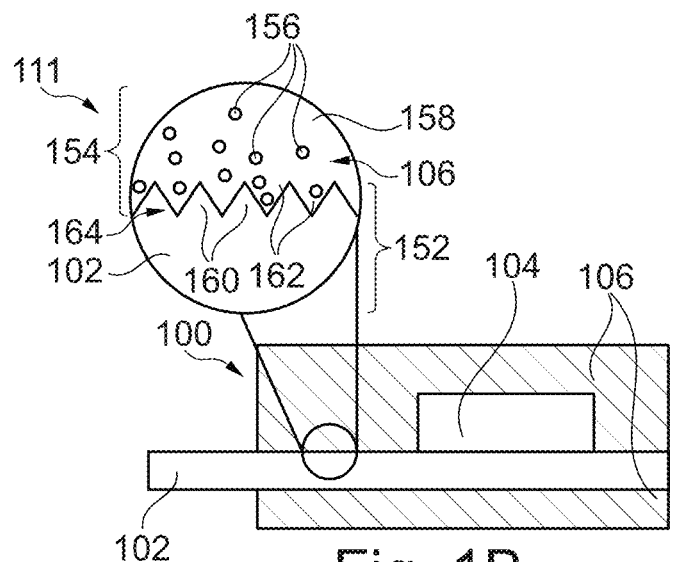
FIG. 1B illustrates a package according to an exemplary embodiment.

FIG. 1B illustrates a package 100 according to an exemplary embodiment.

The cross-sectional view of the package 100 illustrated in FIG. 1B shows functional package bodies 102, 104 in form of a carrier 102 and an electronic component 104 mounted on the carrier 102. An encapsulant 106 encapsulates the functional package bodies 102, 104.

As shown in a detail 111, a structure 150 (as in FIG. 1A) is provided as an interface between the encapsulant 106 and a respective functional package body 102, 104 (FIG. 1B illustrates this for the carrier 102 only). The first sub-structure 152 forms part of the respective functional package body 102, 104. The second sub-structure 154 corresponds to the encapsulant 106.

Figure 2:
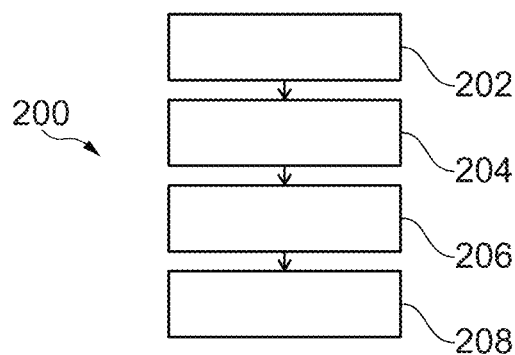
FIG. 2 illustrates a flowchart of a method according to an exemplary embodiment.

FIG. 2 illustrates a flowchart 200 of a method of manufacturing a structure 150 according to an exemplary embodiment.

As shown in a block 202, the method comprises contacting a first sub-structure 152 with a second sub-structure 154. Corresponding to block 204, the method further comprises configuring the second sub-structure 154 as a composite comprising filler particles 156 in a matrix 158. As illustrated by block 206, the method comprises configuring a surface of the first sub-structure 152 with a surface profile having first elevations 160 and first recesses 162. Moreover, the method comprises at least partially inserting at least part of the filler particles 156 in the first recesses 162 so as to form an interlayer 164 comprising the first elevations 160 of the first sub-structure 152 and filler particles 156 in the matrix 158 of the second sub-structure 154 (compare block 208).

Figure 3:
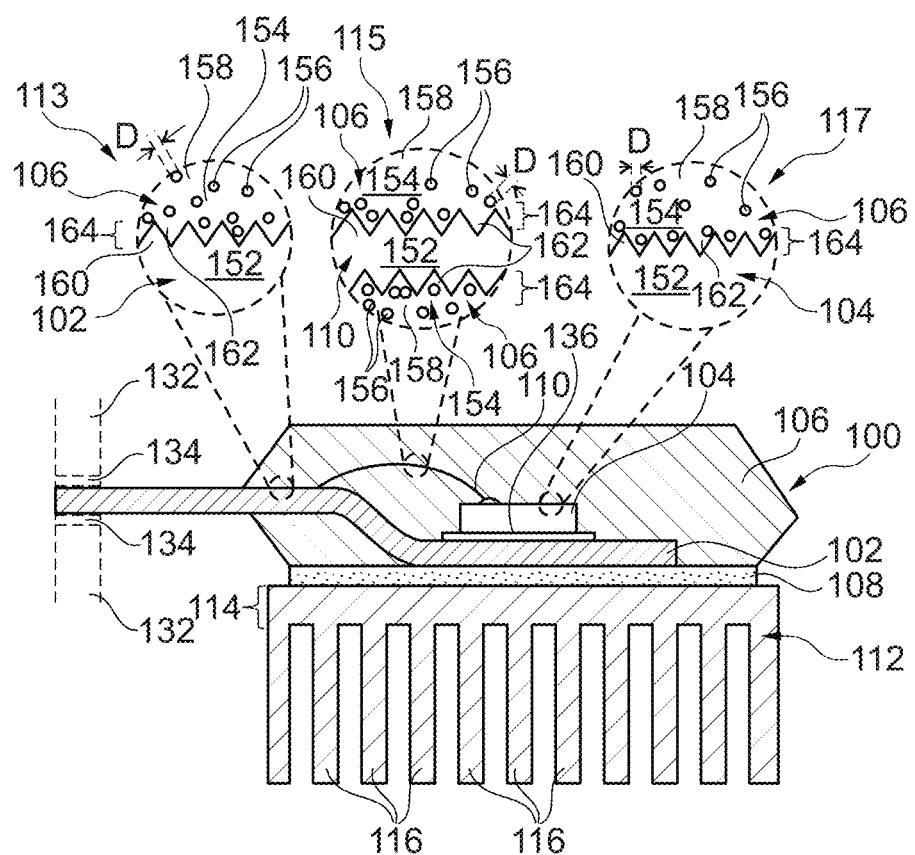
FIG. 3 illustrates a cross-sectional view of a package according to an exemplary embodiment to be mounted on a mounting structure.

FIG. 3 illustrates a cross-sectional view of a package 100, which is embodied as a Transistor Outline (TO) package, according to an exemplary embodiment. The package 100 is mounted on a mounting structure 132, here embodied as printed circuit board.

The mounting structure 132 comprises an electric contact 134 embodied as a plating in a through hole of the mounting structure 132. When the package 100 is mounted on the mounting structure 132, an electronic component 104 of the package 100 is electrically connected to the electric contact 134 via an electrically conductive carrier 102, here embodied as a leadframe made of copper, of the package 100.

The package 100 thus comprises the electrically conductive carrier 102, the electronic component 104 (which is here embodied as a power semiconductor chip) adhesively (see reference numeral 136) mounted on the carrier 102, and an encapsulant 106 encapsulating part of the carrier 102 and the electronic component 104.

As shown in details 113, 115 and 117, the encapsulant 106 is a mold compound comprising a matrix 158 (of epoxy resin) and filling particles 156 (for instance made of aluminum oxide) in the matrix 158. The filling particles 156 have a diameter D.

As can be taken from FIG. 3, a pad on an upper main surface of the electronic component 104 is electrically coupled to the carrier 102 via a bond wire as electrically conductive contact element 110.

During operation of the power package 100, the power semiconductor chip in form of the electronic component 104 generates a considerable amount of heat. At the same time, it shall be ensured that any undesired current flow between a bottom surface of the package 100 and an environment is reliably avoided.

For ensuring electrical insulation of the electronic component 104 and removing heat from an interior of the electronic component 104 towards an environment, an electrically insulating and thermally conductive interface structure 108 may be provided which covers an exposed surface portion of the carrier 102 and a connected surface portion of the encapsulant 106 at the bottom of the package 100. The electrically insulating property of the interface structure 108 prevents undesired current flow even in the presence of high voltages between an interior and an exterior of the package 100. The thermally conductive property of the interface structure 108 promotes a removal of heat from the electronic component 104, via the electrically conductive carrier 102 (of thermally properly conductive copper), through the interface structure 108 and towards a heat dissipation body 112. The heat dissipation body 112, which may be made of a highly thermally conductive material such as copper or aluminum, has a base body 114 directly connected to the interface structure 108 and has a plurality of cooling fins 116 extending from the base body 114 and in parallel to one another so as to remove the heat towards the environment.

Again referring to detail 117, a structure 150 corresponding to FIG. 1A is provided as an interface between the encapsulant 106 (corresponding to the second sub-structure 154) and a metallic surface of the electronic component 104 (corresponding to the first sub-structure 152) as functional package body. Accordingly and referring to detail 113, a structure 150 corresponding to FIG. 1A is also provided as an interface between the encapsulant 106 (corresponding to the second sub-structure 154) and a metallic surface of the carrier 102 (corresponding to the first sub-structure 152) as further functional package body. Referring to detail 115, a structure 150 corresponding to FIG. 1A is also provided as an interface between the encapsulant 106 (corresponding to the second sub-structure 154) and a metallic surface of the electrically conductive contact element 110 (corresponding to a first sub-structure 152 on each of the shown two opposing surfaces) as yet another functional package body. Preferably, all metallic surfaces of functional package bodies 102, 104, 110 may be configured as first sub-structure 152 for forming an interlayer 164 as described in FIG. 1A and below (see FIG. 4 and FIG. 5) in further detail. By taking this measure, the flexural strength and thus the mechanical stability of the package 100 may be increased and the tendency of delamination within package 100 may be suppressed.

Figure 4:
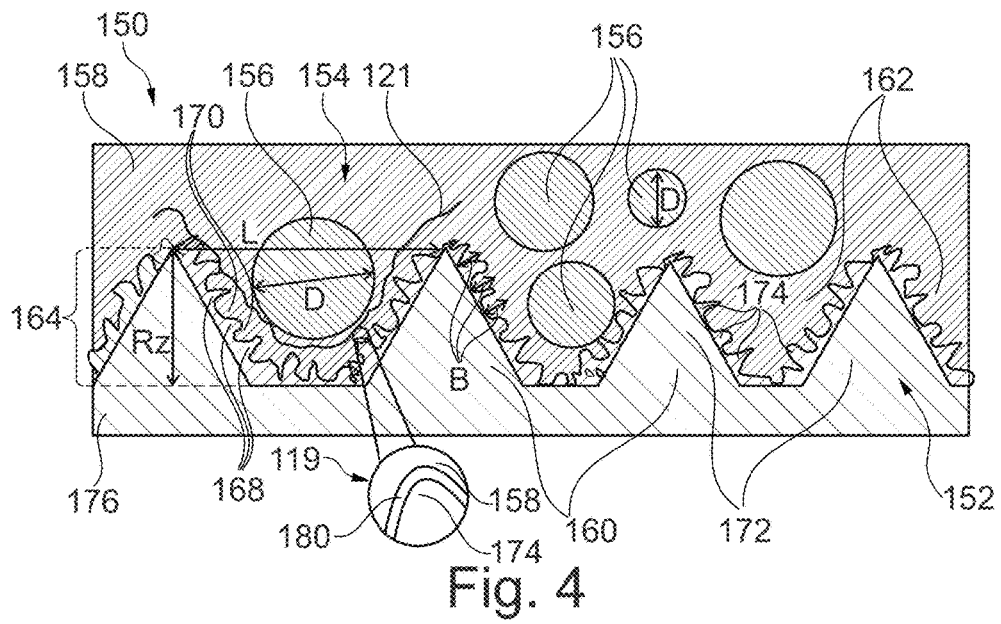
FIG. 4 illustrates an interlayer of a structure for a package according to an exemplary embodiment.

FIG. 4 illustrates an interlayer 164 of a structure 150 for a package 100 according to an exemplary embodiment.

As shown, the structure 150 comprising a first sub-structure 152 and a second sub-structure 154 in contact with the first sub-structure 152.

The first sub-structure 152 comprises a base body 176 on which first elevations 160 are formed. According to Figure the first elevations 160 taper towards the second sub-structure 154. The base body 176 and the first elevations 160 may be made of the same material, for example copper. According to FIG. 4, the base body 176 and the first elevations 160 are in direct physical contact with each other. More specifically, the base body 176 and the first elevations 160 may be integrally formed. The surface of the first sub-structure 152 has second elevations 168 and second recesses 170 formed on the first elevations 160 and on the first recesses 162. For instance, the sequence of second elevations 168 may be formed by a porous ZnV layer (or a ZnMo layer). As a result, a first portion 172 of the first sub-structure 152 defining the first elevations 160 and a second portion 174 of the first sub-structure 152 defining the second elevations 168 are made of different materials.

The second sub-structure 154 is embodied as a composite comprising filler particles 156 (for instance made of inorganic materials such as metal oxide spheres) in a matrix 158 (such as an epoxy resin).

As shown, a surface of the first sub-structure 152 has a surface profile or topology with first elevations 160 and first recesses 162 configured for enabling some of the filler particles 156 to partially or entirely enter the first recesses 162 to thereby form interlayer 164. Said interlayer comprises the first elevations 160 of the first sub-structure 152 and the filler particles 156 in the matrix 158 of the second sub-structure 154.

As shown, the first elevations 160 and first recesses 162 define a coarse first roughness. For instance, the first elevations 160 and the first recesses 162 have a depth Rz of about 1 μm. A vertical thickness of the interlayer 164 corresponds to the vertical thickness Rz of the first elevations 160 and may thus be for instance 1 μm as well. The filler particles 156 can have a distribution of different diameters D in a range from 50 nm to 1 μm, wherein larger dimensions of at least part of the filler particles 156 are possible as well. In other words, the filler particles 156 have an inhomogeneous diameter distribution. In view of this dimensioning of the filler particles 156, they may be located within interlayer 164. For instance, at least 1 volume percent, in particular at least 5 volume percent, more particularly at least 10 volume percent of the interlayer 164 may be contributed by the filler particles 156. A distance L between adjacent top peaks 166 of first elevations 160 may be for instance 2 μm. Hence, a ratio between depth Rz and distance L may be 0.5. This quite large value ensures that the material of the interlayer 164 is a proper and highly inhomogeneous mixture of material of matrix 158, filler particles 156, and the first elevations 152.

As can be taken from FIG. 4 as well, second elevations 168 and second recesses 170 define a finer second roughness being smaller than the coarser first roughness. Descriptively speaking, the second elevations 168 are modulated on a respective first elevation 152. The second elevations 168 and second recesses 170 have nano-porous properties and thereby increase the contact surface between first sub-structure 152 and second sub-structure 154 to thereby further enhance adhesion. For example, the second elevations 168 and second recesses 170 have a depth B of about 30 nm. In view of their smaller dimensions, the second elevations 168 and second recesses 170 are configured for enabling material of the matrix 158 to enter the second recesses 170, whereas the larger filler particles 156 may be incapable of entering the second recesses 170. Descriptively speaking, the second elevations 168 increase the contact surface with material of matrix 158 and thereby function as a porous morphological adhesion promoter.

Advantageously, the filler particles 156 may be provided with a value of the coefficient of thermal expansion which is selected—as a result of the material selection—so that the presence of the filler particles 156 in the interlayer 164 reduces a mismatch between the coefficients of thermal expansion between the material of the first sub-structure 152 and the material of the second sub-structure 154, compared with a scenario in which no filler particles 156 are located in the interlayer 164, i.e. a scenario in which the first recesses 162 are completely filled with material of matrix 158.

Optionally and as indicated in detail 119, structure 150 may comprise an additional adhesion promoting material 180 between the second elevations 168 and the second recesses 170 on the one hand and the second sub-structure 154 on the other hand. Such an additional adhesion promoting material 180 made for instance be embodied as an adhesion promoting thin film.

With the configuration according to FIG. 4, an interface between the first sub-structure 152 and the second sub-structure 154 may be provided with improved flexural strength by constituting interlayer 164. Said interface with improved flexural strength may be obtained by interlayer 164 relying on a combination of microscopic and macroscopic adhesion promoting structures in form of larger first elevations 160 and smaller second elevations 168, wherein each group of second elevations 168 is formed on one of the first elevations 160 or on one of the first recesses 162. As a result, an improved interface area adjacent to a copper surface may be obtained. A morphological adhesion promoter may be formed as second elevations 168 (for instance by electroplating or by atomic layer deposition, ALD). The first sub-structure 152 may then be connected in a strongly adhesive way to the second sub-structure 154 comprising matrix 158 (for instance embodied as (for example polymer) resin) and filler particles 156.

Advantageously, interlayer 164 has a lower CTE value than pure epoxy material according to matrix 158. By making it possible for the filler particles 156 to enter the first recesses 162, a CTE compensation occurs which results in lower stress.

Figure 10:
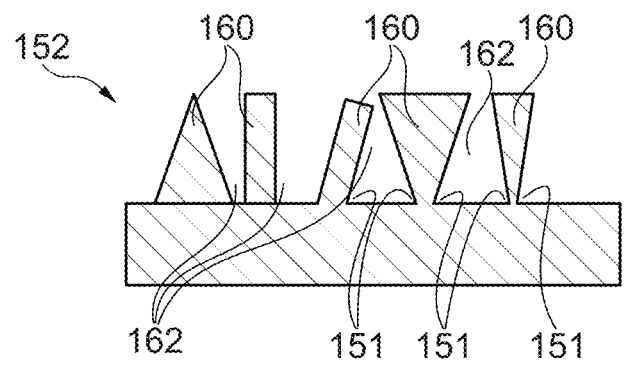
FIG. 10 illustrates undercuts of first elevations of a structure for a package according to an exemplary embodiment.

As an alternative to the illustration in FIG. 4, it may be possible that the pores in form of the first recesses 162 show a side wall angle of smaller than 90° (rather than larger than 90°, as illustrated in FIG. 4). Such a configuration with a side wall angle of smaller than 90° is shown in FIG. 10 on the right hand side and may result in the formation of undercuts 151, which further promotes adhesion.

Reference sign 121 in FIG. 4 schematically illustrates a likely crack path along which a crack within structure 150 may occur in the event of excessive mechanical load exerted to structure 150 (for instance a shear force). As shown, crack path 121 is substantially prolonged and rendered complex by ensuring that filler particles 156 are located in a substantial amount in the first recesses 162. Descriptively speaking, the likelihood of the occurrence of cracks or fissures within the interlayer 164 may therefore be reduced and the mechanical stability of the structure 150 as a whole may be improved.

Figure 5:
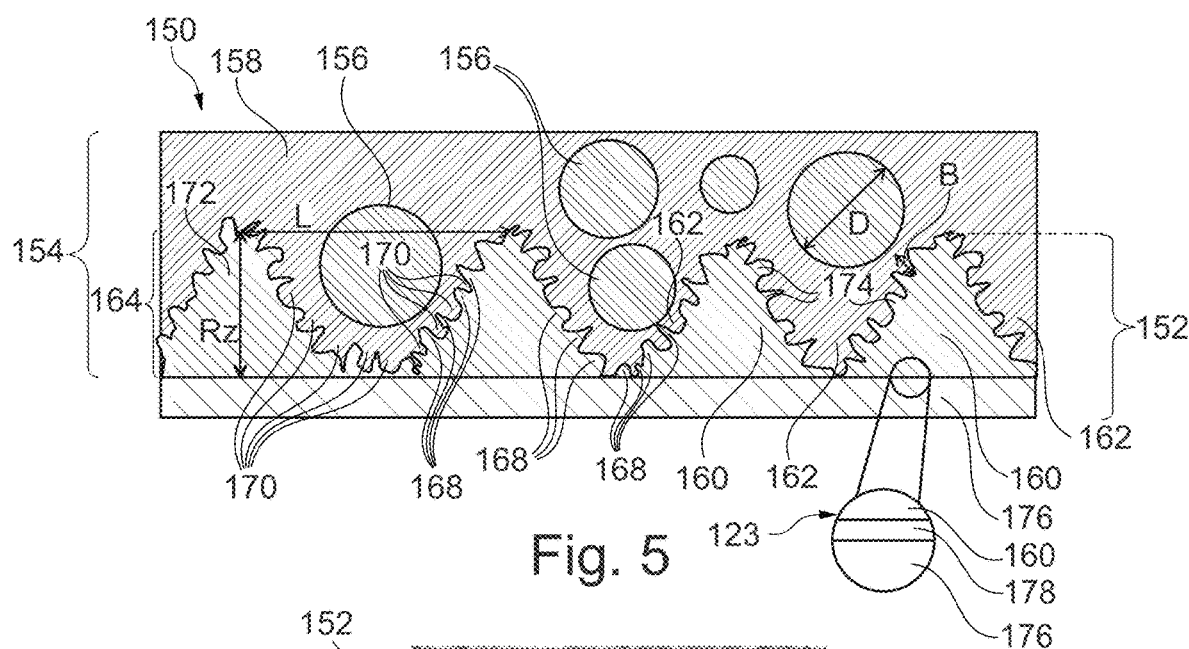
FIG. 5 illustrates an interlayer of a structure for a package according to another exemplary embodiment.

FIG. 5 illustrates an interlayer 164 of a structure 150 for a package 100 according to another exemplary embodiment.

The embodiment of FIG. 5 differs from the embodiment of FIG. 4 in particular in that, according to FIG. 5, first portion 172 of the first sub-structure 152 defining the first elevations 160 and second portion 174 of the first sub-structure 152 defining the second elevations 168 are made of the same material and may be integrally formed. This configuration may make it possible to form the first elevations 160 and the second elevations 168 in a common simultaneous process, preferably by electroplating.

Furthermore, the base body 176 and the first elevations 160 are made of different materials according to FIG. 5. For instance, the base body 176 may be made of copper, whereas the first elevations 160 and the second elevations 168 may be integrally formed (for instance from ZnV). Moreover, FIG. 5 shows an optional intermediate layer 178, such as a seed layer, between the base body 176 and the first elevations 160 (see detail 123). Intermediate layer 178 may promote adhesion between the material of the base body 176 on the one hand and of the first and second elevations 160, 168 on the other hand.

FIG. 6 to FIG. 9 are images of structures 150 of packages 100 according to exemplary embodiments.

Figure 6:
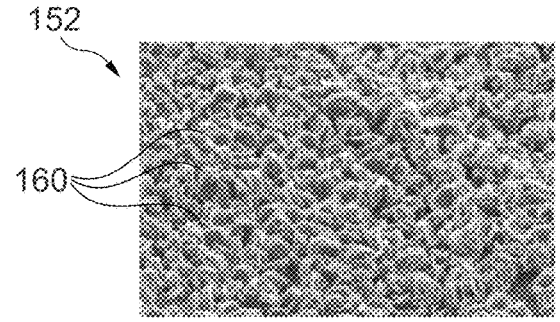
FIG. 6 to FIG. 9 are images of structures of packages according to exemplary embodiments.

FIG. 6 illustrates a plan view of a first sub-structure 152 and illustrates in particular a carpet-like arrangement of first elevations 160. FIG. 6 shows an SEM (scanning electron microscope) image.

Figure 7:
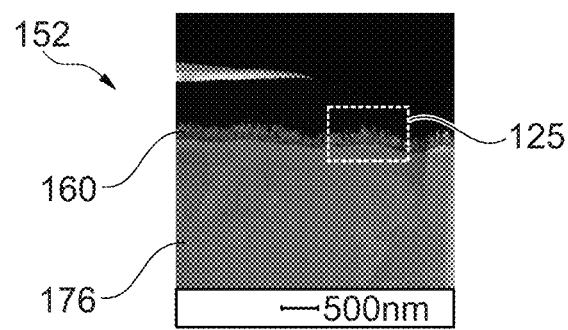

FIG. 7 is a cross-sectional view corresponding to FIG. 6 and shows in particular the first elevations 160 on a base body 176. FIG. 7 (and correspondingly FIG. 8 and FIG. 9) shows a TEM (transmission electron microscope) image.

Figure 8:
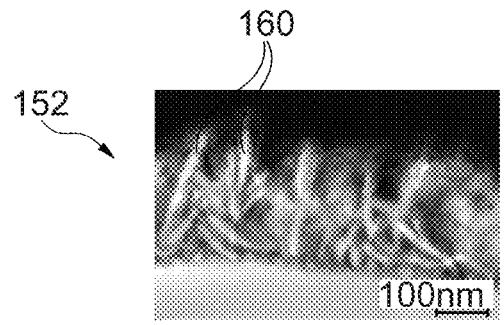

FIG. 8 shows a detail 125 defined in FIG. 7.

Figure 9:
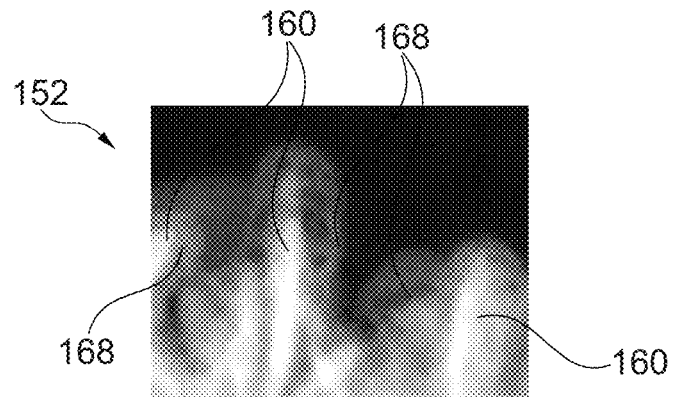

FIG. 9 shows a zoomed part of FIG. 8. Hence, also second elevations 168 on the first elevations 160 are visible.

In combination, FIG. 6 to FIG. 9 show that the first elevations 160 and the second elevations 168 are arranged in a random fashion over a continuous surface area. The double morphological adhesive promoter in form of elevations 160, 168 are here embodied as a ZnV layer with a total layer thickness of 0.2 µm. The second elevations 168 may be embodied as Zn dendrites or crystallites and may have a dimension in a range from 10 nm to 20 nm. More specifically, the elevations 160, 168 are here embodied as a porous shell of vanadium oxide with zinc traces.

More generally, exemplary embodiments may combine first elevations 160 having macro-roughness with second elevations 168 having nano-roughness. Typical dimensions of the macroscopic first elevations 160 may be in a range from 100 nm to 1 µm, wherein the nano-roughness of the second elevations 168 may correspond with typical dimensions in a range from 1 nm to 30 nm.

FIG. 10 illustrates undercuts 151 of first elevations 160 of a structure 150 for a package 100 according to an exemplary embodiment.

When one or more undercuts 151 are formed between the base body 176 and the first elevations 160, a very pronounced mechanical interlocking and thereby adhesion within interlayer 164 may be obtained (see right hand side of FIG. 10). FIG. 10 shows that regions with (see right hand side of FIG. 10) and without (see left hand side of FIG. 10) undercuts 151 may be combined. The presence of undercuts 151 correspond to a pore geometry with a side angle smaller than 90° (i.e. forming the undercuts 151).

Figure 11:
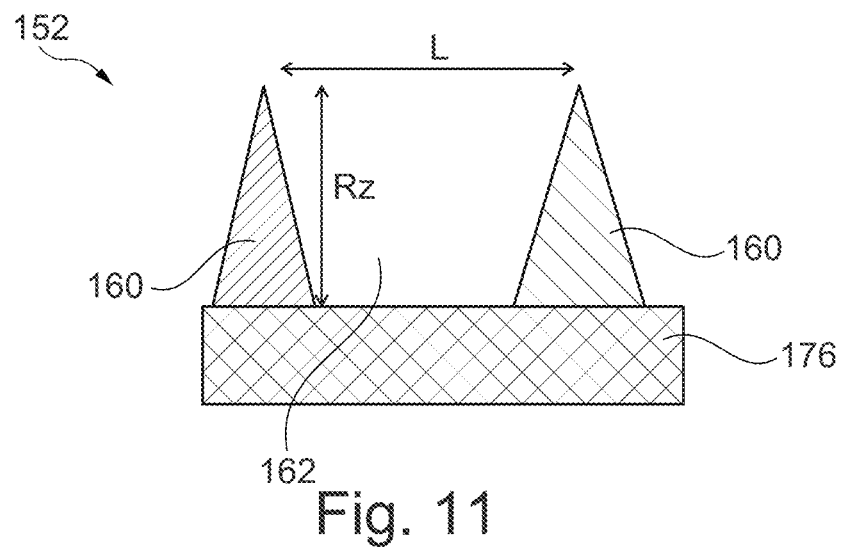
FIG. 11 illustrates a relation between a vertical depth of first elevations and a distance between adjacent first elevations of a structure for a package according to an exemplary embodiment.
Figure 12:
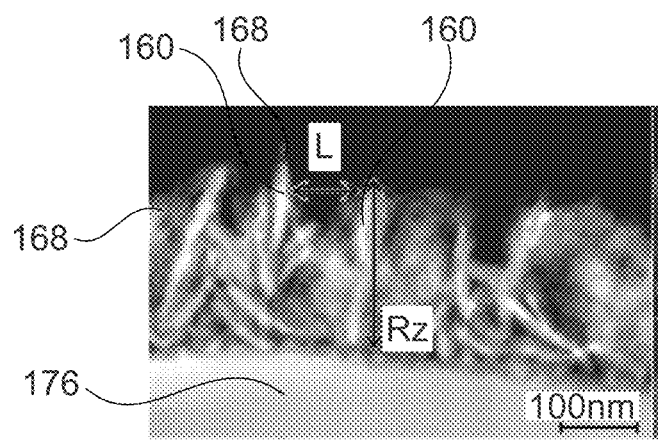
FIG. 12 illustrates a relation between a vertical depth of first elevations and a distance between adjacent first elevations derived from an image of a structure for a package according to an exemplary embodiment.

FIG. 11 illustrates schematically a relation between a vertical depth Rz of first elevations 160 and a distance L between adjacent first elevations 160 of a structure 150 for a package 100 according to an exemplary embodiment. FIG. 12 shows a corresponding experimentally captured image.

A first sub-structure 152 according to an exemplary embodiment may be characterized by a geometry factor Rz/L larger than 0.2 (in particular in a range from 0.2 to 5). In this context, Rz may denote a height of the first elevations 160, and L may denote a distance between adjacent peaks of first elevations 160. For instance, an absolute value of Rz may be in a range from 0.1 µm to 10 µm, for example 1 µm.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A structure, comprising:
a first sub-structure; and
a second sub-structure coupled with the first sub-structure and being a composite comprising filler particles in a matrix,
wherein a surface of the first sub-structure has a surface profile with first elevations and first recesses configured to enable at least part of the filler particles to at least partially enter the first recesses to thereby form an interlayer comprising the first elevations of the first sub-structure and filler particles in the matrix of the second sub-structure,
wherein the surface of the first sub-structure has second elevations and second recesses formed on the first elevations and the first recesses,
wherein the second recesses are dimensioned to enable at least part of the matrix to at least partially enter the second recesses and are dimensioned to disable the filler particles to enter the second recesses.

2. The structure of claim 1, wherein the first elevations and the first recesses have a depth in a range from 0.1 µm to 50 µm.

3. The structure of claim 1, wherein at least part of the filler particles have a diameter in a range from 10 nm to 10 µm.

4. The structure of claim 1, wherein a ratio between a depth of the first elevations and a distance between top peaks of adjacent first elevations is in a range from 0.2 to 5.

5. The structure of claim 1, wherein the second elevations and the second recesses have a depth in a range from 1 nm to 100 nm.

6. The structure of claim 1, wherein the first sub-structure comprises a base body on which the first elevations are formed.

7. The structure of claim 6, wherein:
the base body and the first elevations are made of the same material; and/or
the base body and the first elevations are in direct physical contact with each other.

8. The structure of claim 6, further comprising:
an intermediate layer between the base body and the first elevations.

9. The structure of claim 8, wherein at least one undercut is formed between the base body and the first elevations, wherein the at least one undercut is formed to promote mechanical interlocking and thereby adhesion within the interlayer and/or the at least one undercut corresponds to a pore geometry with a side angle smaller than 90°.

10. The structure of claim 8, wherein the filler particles have a value of the coefficient of thermal expansion which is selected so that the presence of the filler particles in the interlayer reduces a mismatch between the coefficients of thermal expansion between the first sub-structure and the second sub-structure.

11. The structure of claim 1, wherein the second elevations and the second recesses are configured as a porous adhesion promoter.

12. The structure of claim 1, wherein at least one of the first elevations and the second elevations are arranged in a random fashion over a continuous surface area.

13. A package, comprising:
at least one functional package body;
an encapsulant encapsulating at least part of the at least one functional package body; and
the structure of claim 1, the structure being formed as an interface between the encapsulant and at least part of the at least one functional package body,
wherein the first sub-structure forms part of the at least one functional package body and the second sub-structure forms at least part of the encapsulant.

14. The package of claim 13, wherein the at least one functional package body comprises at least one of a carrier configured to carry an electronic component, an electronic component, and an electrically conductive contact element configured to electrically couple an electronic component with a carrier.

15. The package of claim 13, wherein:
the structure is formed as an interface between the encapsulant and a metallic surface of the at least one functional package body; and/or
the package is a power module.

* * * * *